United States Patent
Johnson et al.

(10) Patent No.: US 10,362,255 B2
(45) Date of Patent: Jul. 23, 2019

(54) MULTI-CONVERSION GAIN PIXEL CONFIGURATIONS

(71) Applicant: SEMICONDUCTOR COMPONENTS INDUSTRIES, LLC, Phoenix, AZ (US)

(72) Inventors: Richard Scott Johnson, Boise, ID (US); Ross F. Jatou, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 7 days.

(21) Appl. No.: 15/428,549

(22) Filed: Feb. 9, 2017

(65) Prior Publication Data
US 2018/0227528 A1    Aug. 9, 2018

(51) Int. Cl.
| | |
|---|---|
| H04N 5/374 | (2011.01) |
| H04N 5/378 | (2011.01) |
| H01L 27/146 | (2006.01) |
| H04N 9/04 | (2006.01) |
| H04N 5/347 | (2011.01) |
| H04N 5/355 | (2011.01) |
| H04N 5/3745 | (2011.01) |

(52) U.S. Cl.
CPC ............ *H04N 5/378* (2013.01); *H04N 5/347* (2013.01); *H04N 5/3559* (2013.01); *H04N 5/35563* (2013.01); *H04N 5/3745* (2013.01); *H04N 9/045* (2013.01); *H01L 27/14621* (2013.01)

(58) Field of Classification Search
CPC ...... H04N 5/3742; H04N 5/378; H04N 9/045; H04N 5/23245; H01L 27/14621
See application file for complete search history.

(56) References Cited

U.S. PATENT DOCUMENTS

| | | | |
|---|---|---|---|
| 7,286,174 B1* | 10/2007 | Weale | .................... H04N 5/335 250/208.1 |
| 7,327,393 B2 | 2/2008 | Ying et al. | |
| 7,859,581 B2 | 12/2010 | Guidash | |
| 8,729,451 B2 | 5/2014 | Bikumandla | |
| 8,847,136 B2 | 9/2014 | Ayers et al. | |
| 9,006,635 B2* | 4/2015 | Kurokawa | ............ H01L 27/144 250/208.1 |
| 9,247,170 B2 | 1/2016 | Komori et al. | |
| 9,363,450 B2 | 6/2016 | Nakamura et al. | |
| 9,936,153 B1* | 4/2018 | Mao | ....................... H04N 5/378 |

(Continued)

*Primary Examiner* — Abdelaaziz Tissire
(74) *Attorney, Agent, or Firm* — Treyz Law Group, P.C.; Tianyi He

(57) ABSTRACT

An image sensor may include an array of image pixels formed in rows and columns. Each image pixel in the array may include a photodiode and multiple signal readout paths connected to the photodiode. Each readout path may include a separate floating diffusion node and source follower transistor. The number of signal readout paths simultaneously enabled during an image capture operation may be determined by the exposure level such that the pixel operates with either high or low conversion gain. Several such image pixels of like color in the pixel array may be connected via a shared photodiode interconnection line such that image signals from interconnected pixels may either be binned and read out on a single readout path or read out individual on separate readout paths.

20 Claims, 7 Drawing Sheets

(56) References Cited

U.S. PATENT DOCUMENTS

| | | | | |
|---|---|---|---|---|
| 2003/0010896 | A1* | 1/2003 | Kaifu | H04N 3/1562 250/208.1 |
| 2003/0086008 | A1* | 5/2003 | Nagano | H04N 9/045 348/272 |
| 2004/0257305 | A1* | 12/2004 | Liao | G09G 5/003 345/60 |
| 2006/0103749 | A1 | 5/2006 | He | |
| 2006/0146159 | A1* | 7/2006 | Farrier | H01L 27/14603 348/308 |
| 2007/0035649 | A1 | 2/2007 | McKee | |
| 2008/0079833 | A1* | 4/2008 | Ichikawa | G01S 7/4816 348/311 |
| 2009/0032852 | A1* | 2/2009 | Song | H01L 27/14609 257/292 |
| 2009/0095986 | A1* | 4/2009 | Neukom | H04N 3/155 257/225 |
| 2011/0149057 | A1* | 6/2011 | Beck | A61B 1/00057 348/65 |
| 2011/0176042 | A1* | 7/2011 | Kato | H01L 27/14609 348/294 |
| 2012/0002089 | A1* | 1/2012 | Wang | H01L 27/14603 348/297 |
| 2012/0033118 | A1* | 2/2012 | Lee | H01L 27/14609 348/296 |
| 2012/0188424 | A1* | 7/2012 | Li | H01L 27/14609 348/294 |
| 2012/0312964 | A1* | 12/2012 | Yamashita | H04N 5/347 250/208.1 |
| 2013/0020466 | A1* | 1/2013 | Ayers | H01L 27/14609 250/208.1 |
| 2013/0092820 | A1* | 4/2013 | Takemoto | H04N 5/369 250/208.1 |
| 2014/0028883 | A1* | 1/2014 | Shin | G01S 17/89 348/297 |
| 2014/0368680 | A1* | 12/2014 | Ayers | H01L 27/14609 348/216.1 |
| 2015/0054973 | A1* | 2/2015 | Velichko | H04N 5/369 348/218.1 |
| 2015/0115291 | A1* | 4/2015 | Kim | H01L 31/16 257/80 |
| 2015/0124139 | A1* | 5/2015 | Ishiwata | H04N 5/37452 348/308 |
| 2015/0181140 | A1* | 6/2015 | Onishi | H04N 5/361 348/243 |
| 2015/0281618 | A1* | 10/2015 | Saito | H04N 9/31 348/303 |
| 2015/0356351 | A1* | 12/2015 | Saylor | G01S 17/89 348/164 |
| 2016/0049432 | A1* | 2/2016 | Otaka | H01L 27/14614 348/308 |
| 2016/0165159 | A1* | 6/2016 | Hseih | H04N 5/23235 348/273 |
| 2016/0273961 | A1* | 9/2016 | Kim | G01J 1/44 |
| 2016/0353034 | A1* | 12/2016 | Mauritzson | H04N 5/343 |
| 2016/0363674 | A1* | 12/2016 | Jacob | G01T 1/247 |
| 2017/0353675 | A1* | 12/2017 | Onuki | H04N 13/327 |
| 2018/0182794 | A1* | 6/2018 | Go | H01L 27/14612 |

* cited by examiner

MULTI-CONVERSION GAIN PIXEL CONFIGURATIONS

BACKGROUND

This relates generally to imaging devices, and more particularly, to imaging devices with photodiodes having multiple readout paths of different conversion gain.

Image sensors are commonly used in electronic devices such as cellular telephones, cameras, and computers to capture images. In a typical arrangement, an electronic device is provided with an array of image pixels arranged in pixel rows and pixel columns. Each image pixel contains a photodiode for generating charge in response to incident light. In some types of pixels (i.e., active CMOS pixels) the charge generated by the image pixels is stored at a floating diffusion node coupled to the photodiode. Circuitry is commonly coupled to each pixel column for reading out image signals from the image pixels.

Conventional image pixels have a single readout path which transfers charge generated by the photodiode to the floating diffusion node. In such an arrangement, the conversion gain of the pixel is determined by a fixed charge capacity (i.e., capacitance) of the floating diffusion region. Typically, image pixels having fixed conversion gain may be optimized for performance in either high exposure or low exposure image captures, but not both. An image pixel having an adjustable conversion gain may therefore be desirable.

It is within this context that the embodiments described herein arise.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (i.e., megapixels). Image sensors may include control circuitry such as circuitry for operating the image pixels and readout circuitry for reading out image signals corresponding to the electric charge generated by the photosensitive elements.

Figure 1:
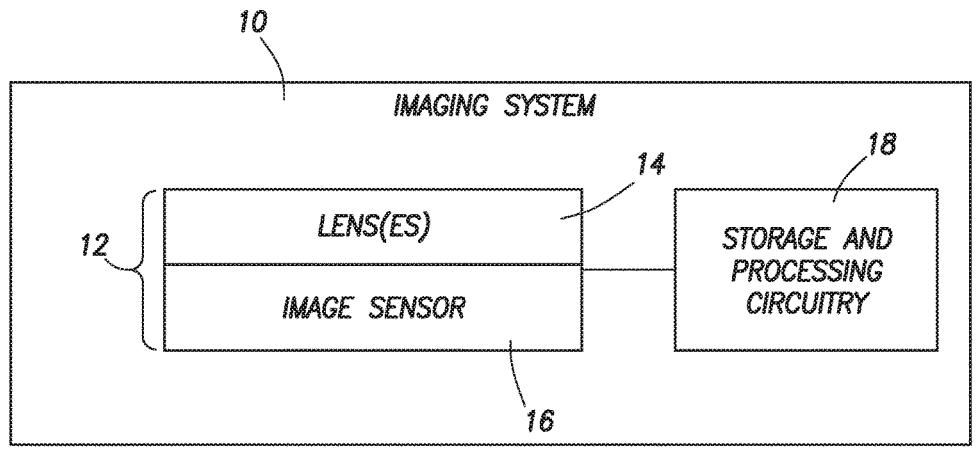
FIG. 1 is a diagram of an illustrative electronic device having an image sensor and processing circuitry for capturing images in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
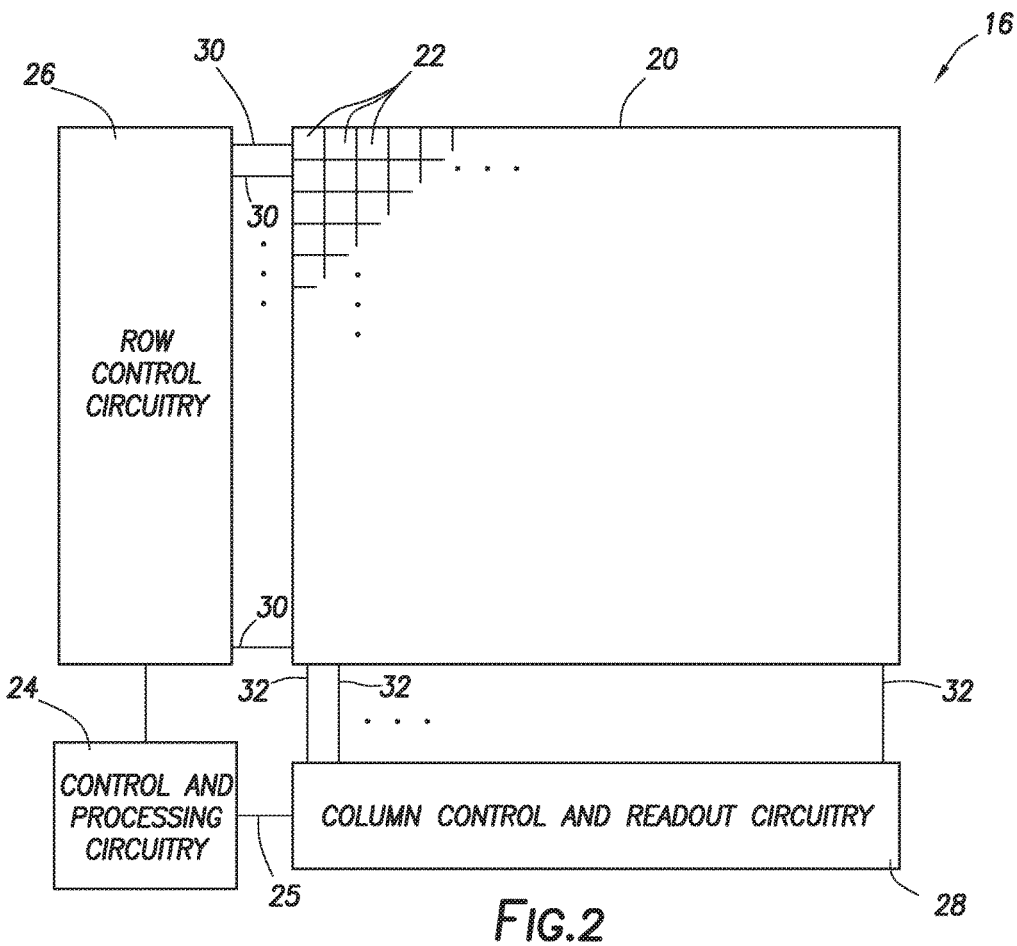
FIG. 2 is a diagram of an illustrative pixel array and associated readout circuitry for reading out image signals from a pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Figure 3:
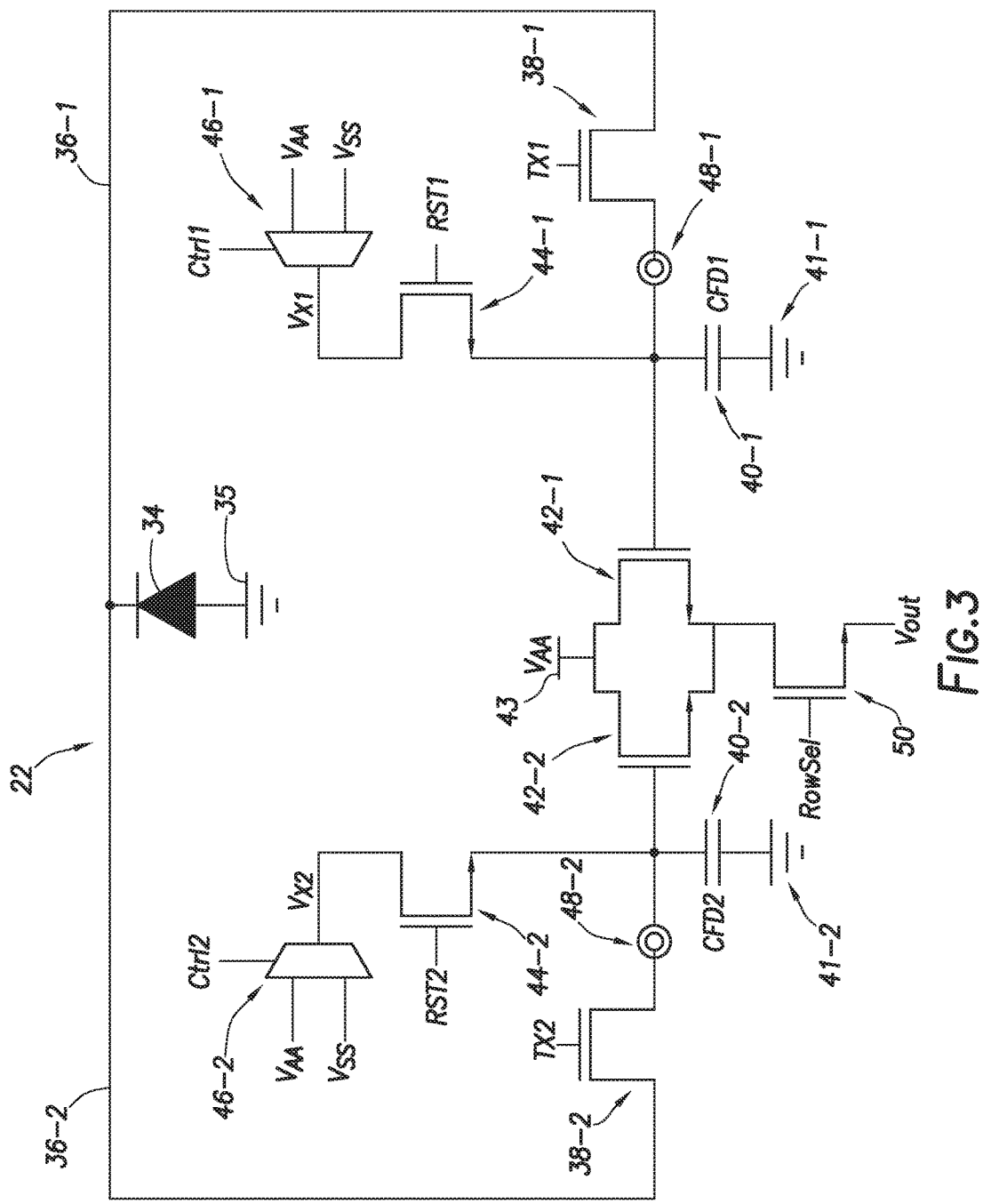
FIG. 3 is a circuit diagram of an illustrative image pixel having multiple signal readout paths with separate floating diffusion nodes in accordance with an embodiment.

The circuit diagram of an illustrative CMOS image pixel 22 that may be used in pixel array 20 is shown in FIG. 3. image pixel 22 may include a photosensitive region 34 (sometimes referred to herein as a photodiode). Photosensitive region 34 may be a silicon diode or a similar component that continuously generates charge while exposed to incident light. Photodiode 34 may be connected to ground terminal 35. In the embodiment of FIG. 3, charge generated by photodiode 34 may be passed to pixel circuitry through two distinct signal paths 36-1 and 36-2.

In the image signal first readout path, bus 36-1 may connect photodiode 34 to floating diffusion node 40-1, which may store the charge accumulated by photodiode 34 during an exposure. Generally, the first floating diffusion node 40-1 may be an isolated region of doped semiconductor material (e.g., a silicon region with charge carriers added by ion implantation, impurity diffusion or other doping techniques) or other physical capacitance structure such as a MIM or PIP capacitor. Because floating diffusion node 40-1 may store charge, FD node 40-1 can be said to have an intrinsic capacitance CFD1.

In some cases, it may be desirable to electrically isolate floating diffusion node 40-1 from photodiode 34 such that charge is generated by the photodiode but is not stored at node 40-1. Therefore, charge transfer gate transistor 38-1 may be connected between photodiode 34 and floating diffusion node 40-1 in order to gate (i.e., block or allow) transmission of charge from the photodiode to the FD node. Control circuitry 26 (shown in FIG. 2) may supply a first charge transfer control signal TX1 the gate terminal of transfer transistor 38-1. While TX1 is asserted (i.e., set to logic "1"), transfer gate 38-1 may pass charge generated by photodiode 34 to floating diffusion node 40-1.

If desired, photodiode 34 may be formed in a different image sensor die than floating diffusion node 40-1 and other readout circuitry. In this case, the first die containing the photodiode may be stacked vertically on top of the second die, and the photodiode may be electrically coupled to floating diffusion node 40-1 and other readout circuitry through junction 48-1.

Similarly, a second bus 36-2 may connect photodiode 34 to a second floating diffusion node 40-2 in a second read-out path. The second floating diffusion node 40-2 may also store charge accumulated by photodiode 34 separately from floating diffusion node 40-1. Because the second floating diffusion node 40-2 may also store charge, the second FD node may have a second intrinsic capacitance CFD2. In one embodiment, the capacitance of the second floating diffusion node, CFD2, may be equal to the capacitance CFD1 associated with first floating diffusion node 40-1. In another embodiment, second floating diffusion capacitance CFD2 may be greater than the first floating diffusion capacitance CFD1. As in the first readout path, charge transfer from photodiode 34 to second floating diffusion node 40-2 may be gated by a second transfer gate 38-2. If desired, the second readout path junction 48-2 may be coupled between second transfer gate 38-2 and second floating diffusion node 40-2. If desired, photodiode 34 may be formed in a different image sensor die than floating diffusion node 40-2 and other readout circuitry. In this case, the first die containing the photodiode may be stacked vertically on top of the second die, and the photodiode may be electrically coupled to floating diffusion node 40-2 and other readout circuitry through junction 48-2.

Similar to the first readout path, control circuitry 26 may supply a second charge transfer control signal TX2 to the gate terminal of transfer gate 38-2. In general, second charge transfer control signal TX2 and first charge transfer control signal TX1 may be generated independently and may not be the same. Thus, at a given time during an exposure, charge generated by photodiode 34 may be stored in first FD node 40-1 only (e.g., by asserting TX1 and deasserting TX2). Similarly, charge accumulated by photodiode 34 may be transferred to and stored in second FD node 40-2 only (e.g., by deasserting TX1 and asserting TX2). Alternatively, it may be desirable for the charge generated by photodiode 34 to be stored in both floating diffusion nodes, one in each readout path. In this case, charge transfer control signals TX1 and TX2 may be asserted simultaneously to electrically couple both floating diffusion nodes to the photodiode. Generally, transfer gates 38-1 and 38-2 may be pulsed once to perform one charge transfer operation or may be pulsed multiple times to perform multiple charge transfer operations.

As shown in FIG. 3, floating diffusion node 40-1 in the first image signal readout path may be connected to a first source follower transistor 42-1 and a first reset transistor 44-1. The source terminal of first source follower transistor 42-1 be connected to power supply line 43 that provides a positive supply voltage $V_{AA}$. The source terminal of first reset transistor 44-1 may be connected to a variable power supply 46-1. In the embodiment of FIG. 3, variable power supply 46-1 may include a multiplexer that selects between positive supply voltages $V_{AA}$ or $V_{ss}$, where $V_{ss}$ is low enough to disable source follower transistor 42-1, but high enough not to cause charge injection. $V_{AA}$ or $V_{ss}$ may be selected based on a control signal CTRL1 and outputs a selected signal $V_{X1}$. For example, when CTRL1 is asserted, multiplexer 46-1 may pass $V_{AA}$ to the source terminal of first reset transistor 44-1. When CTRL1 is deasserted, however, multiplexer 46-1 may pass $V_{ss}$ to the source terminal of reset transistor 44-1 to completely turn off the first image signal read out path (e.g., to avoid data contention). Control signal CTRL1 may be supplied by circuitry such as control circuitry 26 of FIG. 2.

The gate terminal of reset transistor 44-1 may receive a first reset signal RST1 from control circuitry such as control circuit 26. Before capturing an image signal in the first readout path, first reset signal RST1 may be held high in order to reset first floating diffusion node 40-1 (e.g., by draining any charge stored in FD node 40-1 through ground terminal 41-1).

Similarly, the second floating diffusion node 40-2 in the second image signal readout path may be connected to a second source follower transistor 42-1 and a second reset transistor 44-2. The source terminal of second source follower transistor 42-1 also be connected to power supply line 43 that provides positive supply voltage $V_{AA}$. The second reset transistor may be coupled to a second variable power supply circuit 46-2. The second variable power supply 46-2 may include a second multiplexer that selects between $V_{AA}$ and $V_{ss}$ and outputs a second selected signal $V_{X2}$ (e.g., either $V_{AA}$ or $V_{ss}$) to the source terminal of reset transistor 44-2. In general, the selected signal $V_{X2}$ in the second readout path may be different from $V_{X1}$ in the first readout path during any given exposure.

The gate terminal of reset transistor 44-1 may receive a second reset signal RST2 from control circuitry that may or may not be the same as first reset signal RST1. Second readout signal RST2 may be asserted prior to capturing an image signal in the second signal path in order to reset second floating diffusion node 40-2 (e.g., by draining any charge stored in FD node 40-2 through a second ground terminal 42-2).

When image pixel 22 is used to capture an image signal, RST1 and/or RST2 may be deasserted. For example, if only the first readout path is used to capture image data, first reset signal RST1 may be deasserted immediately prior to an exposure. In this case, transfer gate 38-1 may be opened by asserting charge transfer control signal TX1 (but not TX2) to allow charge accumulated by photodiode 34 to be stored in the first floating diffusion node 40-1. The stored charge may increase the potential difference (i.e., voltage) across FD node 40-1. The change in voltage at the gate terminal of source follower transistor 42-1 may then be amplified into a proportional image signal, which may then be passed to the source terminal of row select transistor 50. Collectively, the process of deasserting RST1 and allowing first floating diffusion node 40-1 to store charge from photodiode 34 may be referred to herein as "turning on" or "enabling" source follower transistor 42-1. In this case, the voltage supplied to the second source follower transistor 40-2 in the second readout path may be fixed at zero (e.g., by deasserting CTRL2 to pass $V_{ss}$ to second reset transistor 44-2) in order to minimize data contention.

Similarly, if only the second readout path is used to capture image data, second reset signal RST2 may be deasserted immediately prior to the exposure. Transfer gate 38-2 may then be opened by asserting second charge transfer control signal TX2, allowing charge accumulated by photodiode 34 be stored in second floating diffusion node 40-2. The resulting voltage swing may enable source follower transistor 42-2, which may pass an image signal proportional to the stored charge to the source terminal of row select transistor 50.

If desired, both readout paths may be enabled simultaneously. In this case, RST1 and RST2 may be deasserted prior to exposure and both transfer gates 38-1 and 38-2 may be opened by simultaneously asserting both charge transfer control signals TX1 and TX2. Charge generated by photodiode 34 may then be stored in both first floating diffusion node 40-1 and second floating diffusion node 40-2. The charge may cause voltage changes (i.e., voltage swings) across FD nodes 40-1 and 40-2 that enable both source follower transistor 42-1 and source follower transistor 42-2. Image signals proportional to the stored charge in each readout path may then be binned (i.e., summed together) and passed to the source terminal of row select transistor 50.

The gate terminal of row select transistor 50 may receive a row selection control signal RowSel from control circuitry such as control circuitry 26. When it is desired to read image signals from the row of pixel array 20 that contains image pixel 22, RowSel may be asserted to enable row select transistor 50. When row select transistor 50 is turned on, an image signal $V_{OUT}$ that is proportional to the charge stored at floating diffusion node 40-1 and/or floating diffusion node 40-2 is produced on an output path of pixel 22. As shown in FIG. 2, there are numerous rows and columns of pixels such as image pixel 22 in pixel array 20. Thus, when row select control signal RS is asserted in a given row, a voltage swing with magnitude $V_{OUT}$ may be produced on a path such as column line 32, which may be used to route the signal from the image pixel to readout circuitry (e.g., image readout circuitry 28 of FIG. 2).

The example of FIG. 3 in which image pixel 22 has two readout paths is merely illustrative and is not meant to be limiting. In alternative implementations, image pixel 22 may have any suitable number of readout paths, each having a separate floating diffusion node, transfer gate, source follower transistor, etc. As in the image pixel of FIG. 3, the source follower transistors in each readout path may be selectively enabled or disabled by various control signals before and during an image capture operation. It should be appreciated that the floating diffusion capacitances associated with each readout path may or may not be the same.

Generally, pixel array 20 may be operated in a so-called "low exposure" mode and a "high exposure" or "binned" mode. The mode of operation used will be at least partially determined by the exposure level (i.e., the intensity of incident light) experienced by image pixels 22. Typical pixels have a dynamic exposure range in which an accurate signal can be generated. These exposure levels range from a noise floor (below which the signal-to-noise ratio drops unacceptably) up to a well capacity or saturation capacity (above which the pixel does not generate additional charge even if incident light intensity increases). A "low exposure" setting may therefore refer to an intensity that is lower than a predetermined threshold, while "high exposure" may refer to an intensity that is higher than the predetermined threshold.

For example, low exposure may refer to an exposure level that is within a percentage of the noise floor. In this case, high exposure would refer to any exposure level above low exposure levels. In one embodiment, the exposure threshold may be set at a value equal to 10% of the total dynamic range above the noise floor. In another embodiment, the exposure threshold may be set at a value of 20% of the dynamic range above the noise floor. In yet another embodiment, the exposure threshold may be set at a value of 50% of the dynamic range above noise floor.

Alternatively, high exposure may be defined to be an exposure level above a certain percentage of well capacity. In this case, low exposure would refer to any exposure level below that percentage of well capacity. In one embodiment, the exposure threshold may be set to 25% of well capacity (i.e., saturation). In another embodiment, the exposure threshold may be set to 50% of well capacity. In yet another embodiment, the exposure threshold may be set to 75% of well capacity. It should be appreciated that the exposure thresholds described above are merely illustrative. In general, any suitable exposure threshold may be used to distinguish between high exposure and low exposure situations.

In low exposure situations, the intensity of light incident upon the pixel array is low. As a result, a photodiode such as photodiode 34 in a given image pixel 22 will generate a relatively small amount of charge during a typical low exposure image capture operation. In this case, it is desirable that the total capacitance of active readout paths in the pixel be relatively low so that a large voltage swing (i.e., a strong image signal) may be produced by storing even a small amount charge in the floating diffusion regions. In this way, image pixel 22 may achieve a high conversion gain when operated in low exposure mode. Since the amount of noise in the image signal is generally proportional to the floating diffusion capacitance, low exposure image signals typically have a relatively high maximum signal-to-noise ratio (SNR).

For the image pixel of FIG. 3, a low floating diffusion capacitance may be achieved by keeping the charge transfer gate in one of the readout paths turned off during image capture, thereby enabling only one of the two floating diffusion nodes In high exposure situations, the intensity of light incident upon the pixel array is significantly higher. Since the photodiode in a given image pixel 22 will produce a large amount of charge when capturing image data at high exposures, it is generally desired that the overall capacitance of active readout paths in the image pixel be higher in order to store the generated charge without excessively large voltage swings at the source follower transistor. Operated in high exposure mode, image pixel 22 may have a lower conversion gain than when the pixel is operated in low exposure mode.

Referring to FIG. 3, if the floating diffusion capacitance of the first readout path (CFD1) is equal to the floating diffusion capacitance of the second readout path (CFD2), both transfer gates 38-1 and 38-2 may be switched on to store charge at both FD nodes. Enabling both floating diffusion nodes in this manner may effectively double the charge handling capability of the image pixel and increases the pixel's total capacitance. The image signal corresponding to the charge stored at each node may then be binned (i.e., summed) through the source follower transistors 42-1 and 42-2. Typically, image pixels with higher FD capacitance may produce image signals with higher signal-to-noise ratio than low CFD pixels. However, binning image signals from each readout path in this manner may produce the same voltage swing on the column line (i.e., $V_{OUT}$) while appreciably reducing the SNR (see FIG. 5).

Alternatively, if the floating diffusion capacitances of the two FD nodes are not equal, the higher capacitance read-out path may be selectively enabled to operate the pixel in high exposure mode. These methods of operating an image pixel such as pixel 22 shown in FIG. 3 are described in more detail in FIGS. 4A and 4B.

Figure 4A:
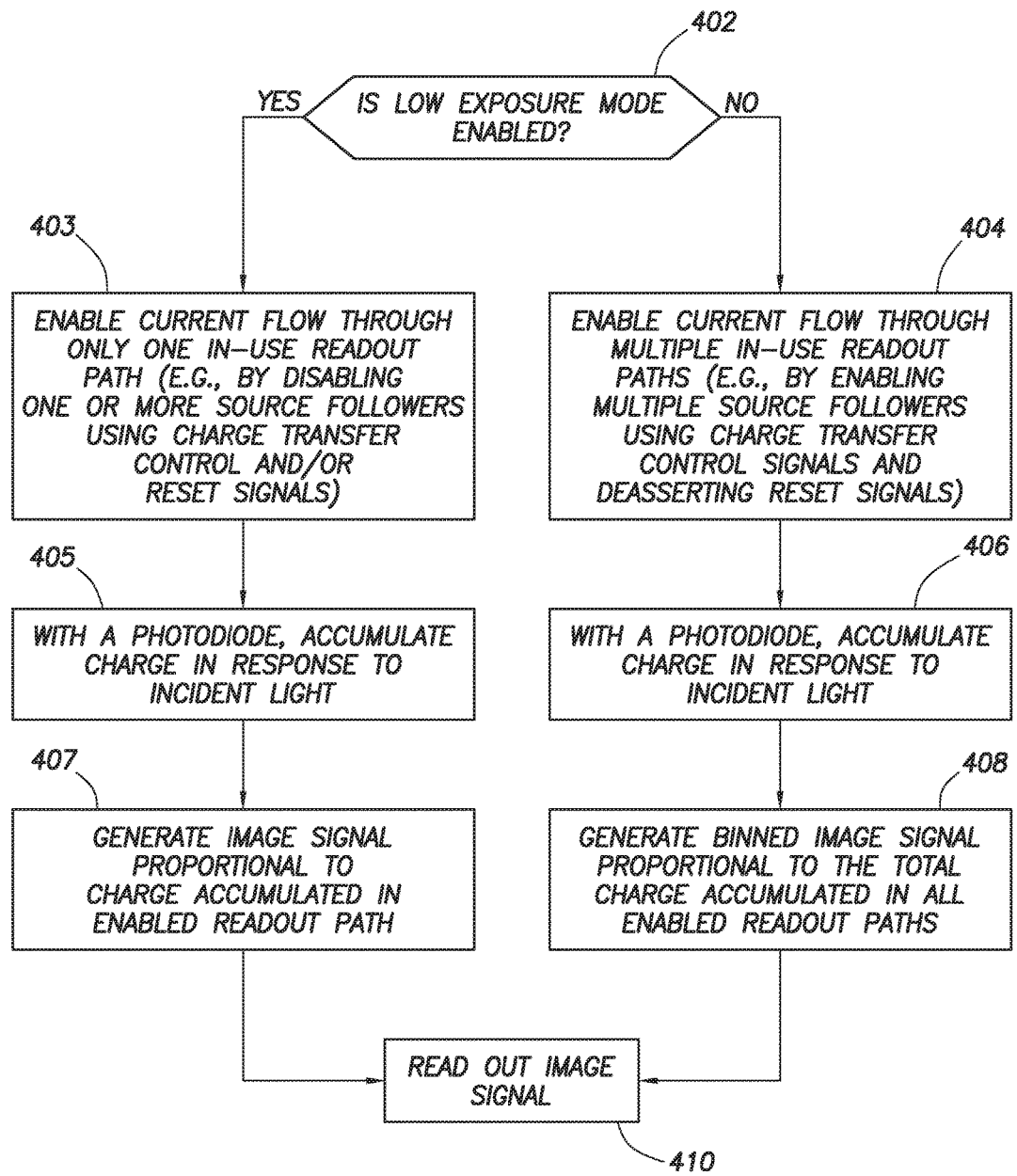
FIG. 4A is a flowchart of illustrative steps for operating the image pixel of FIG. 3 when the capacitances of floating diffusion nodes in each readout path are equal in accordance with an embodiment.

FIG. 4A is a flowchart of illustrative steps in a method of operating an image pixel with multiple readout paths, each having a floating diffusion node with the same capacitance. As an example, the method of FIG. 4A may be used to operate the image pixel 22 shown in FIG. 3 if CFD1 is equal to CFD2. At step 402, it may be determined whether or not the pixel array containing the image pixel is set to operate in low exposure mode. If low exposure mode is enabled, one or more source followers may be disabled at step 403. This may be achieved by blocking charge transfer to the floating diffusions node(s) of one or more readout paths. In the example of FIG. 3, charge transfer control signal TX2 may be deasserted to close transfer gate 38-2 during the image capture operation, effectively removing floating diffusion node 40-2 and its associated source follower from the circuit. Also at step 403, the unused floating diffusion node 40-2 may be reset to zero potential (e.g., by asserting reset signal RST2 and/or using variable power supply 46-2 to provide $V_{ss}$ to reset transistor 46-2). Because the parallel capacitance CFD2 is removed, disabling the second readout path reduces the total capacitance of the image pixel. As a result, step 403 sets the image pixel 22 to operate with high conversion gain.

After disabling one or more readout paths, the high conversion gain pixel may be used generate an image signal in response to incoming light at step 405. In particular, a photodiode such as photodiode 34 in image pixel 22 may be used to generate electric charge in response to a particular wavelength of light.

At step 407, charge may be stored by an in-use floating diffusion node (i.e., the FD node of a readout path not disabled in step 403), producing an image signal that is then read out of the image pixel at step 410. For example, readout may be performing by asserting a row select signal (e.g., RowSel) at the gate terminal of a row select transistor.

Alternatively, if high exposure (i.e., binned) mode is enabled, all readout paths may be enabled simultaneously at step 404. This may be accomplished by deasserting the reset signals (e.g., RST1 and RST2) and asserting the charge transfer control signal (e.g., TX1 and TX2) for each readout path shortly before an image capture operation. By enabling multiple floating diffusion nodes arranged in parallel, enabling all readout paths increases the overall capacitance of the image pixel, setting the pixel to operate at a lower conversion gain.

At step 406, a photodiode in the image pixel (e.g., photodiode 34 of image pixel 22) may generate charge in response to incident light.

A portion of the generated charge may then be stored in the floating diffusion node of each readout path (e.g., FD nodes 40-1 and 40-2), producing a voltage swing at the gate terminal of each corresponding source follower transistor at step 408. The image signals from each in-use source follower may then be binned (i.e., summed) and read out of the image pixel at step 410. For example, read out may be performed by asserting a row select signal (e.g., RowSel) at the gate terminal of a row select transistor such as readout transistor 50 shown in FIG. 3. This binned image signal may be similar in magnitude to the "low exposure" image signal generated by the image pixel when operated in low exposure mode, but may have a higher signal-to-noise ratio than image signals produced by conventional low conversion gain pixels.

Alternatively, both low gain readout and high gain readout may be done sequentially by performing steps 403, 405, and 407 followed by steps 404, 406, and 408. Subsequently, a determination of which image signal is used may be done based on the exposure threshold.

Figure 4B:
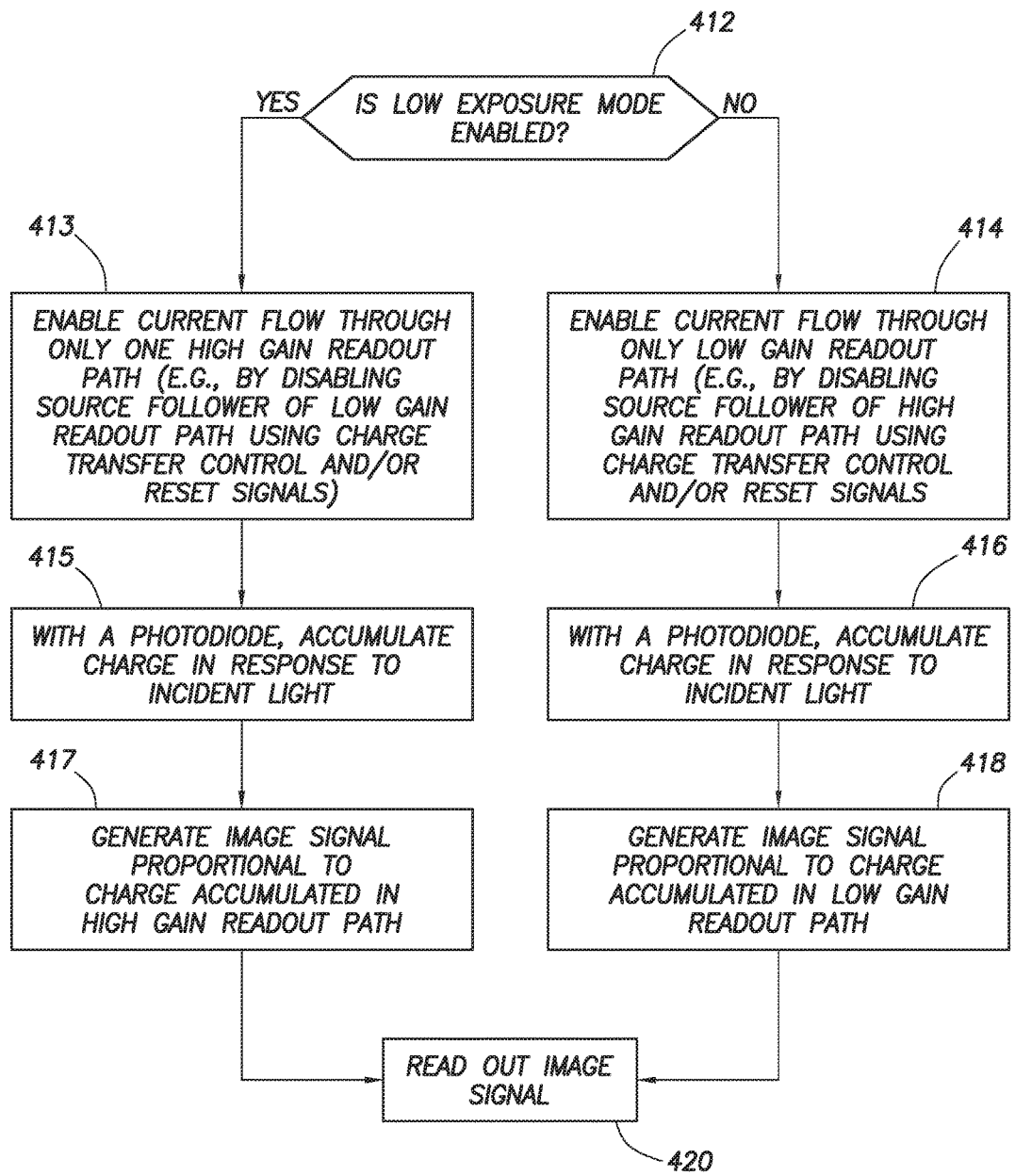
FIG. 4B is a flowchart of illustrative steps for operating the image pixel of FIG. 3 when the capacitance of a floating diffusion node in one readout path is greater than the capacitance of a floating diffusion node in a second readout path in accordance with an embodiment.

In another embodiment, the capacitance of the floating diffusion node in one readout path of the image pixel shown in FIG. 3 may be significantly higher than the capacitance of the floating diffusion node in the other readout path. For example, CFD2 may be larger than CFD1. Illustrative steps in a method for operating such an image pixel are shown in the flowchart of FIG. 4B.

If it is determined that the pixel array is set to operate in low exposure mode at step 412, the readout path with lower floating diffusion capacitance may be selectively enabled at step 413. For example, the transfer gate in the low capacitance (i.e., high gain) readout path may be opened by asserting the corresponding charge transfer control signal (e.g., TX1) the charge transfer control signal provided to the transfer gate in the high capacitance readout path remains deasserted.

At step 415, a photodiode in the image pixel (e.g., photodiode 34) may be used to accumulate charge in response to a given color of incident light. The accumulated charge may be transferred to and stored in the floating diffusion node of the low capacitance readout path (e.g., first floating diffusion node 40-1). The resulting voltage swing at the source follower in the low capacitance readout path produces an image signal at step 417 which may then be read out by enabling the pixel's row select transistor at step 420 (e.g. enabling row select transistor 50 by asserting readout signal RowSel). During exposure and readout, the potential of the unused, high capacitance floating diffusion node may be reset to zero by providing $V_{ss}$ to the corresponding reset transistor and/or asserting the corresponding reset signal RST1.

Alternatively, if the pixel array is set to operate in high exposure mode, the readout path with higher floating diffusion capacitance may be selectively enabled at step 414. In the embodiment of FIG. 3, the transfer gate in the high capacitance readout path may be opened by asserting the corresponding charge transfer control signal (e.g., TX2). Simultaneously, the transfer gate in the low capacitance readout path may be disabled by deasserting the corresponding charge transfer control signal (TX1).

Once the high capacitance (i.e., low gain) readout path is enabled, a photodiode in the image pixel may be exposed to incident light at step 416, generating charge in response to a particular range of wavelengths. The accumulated charge may then be transferred to and stored in the high capacitance floating diffusion node. The voltage swing at the source follower in the high capacitance floating diffusion node produces an image signal at step 418 that may be read out by enabling the pixel's row select transistor at step 420 (e.g. enabling row select transistor 50 by asserting readout signal RowSel).

Alternatively, both low gain readout and high gain readout may be done sequentially by performing steps 413, 415, and 417 followed by steps 414, 416, and 418. Subsequently, a determination of which image signal is used may be done based on the exposure threshold.

Configured in this way, the same image pixel may operate in either a low conversion gain mode (when capturing an image at high exposure levels) or a high conversion gain mode (when capturing an image at low exposure levels). It should be appreciated that the steps described above in connection with FIGS. 4A and 4B are merely illustrative, and that, in some cases, minor details of operating an image pixel that are well known in the art have been omitted so as not to unnecessarily obscure the features of the present invention.

In general, the signal-to-noise ratio (SNR) of an image signal generated by an image pixel may depend on the amount of time for which the photodiode is exposed in to incident light (sometimes called exposure time or integration time). A typical photodiode generates a greater amount of net charge when exposed to light for a longer period of time. Thus, the SNR of an image signal produced by a given pixel may be significantly higher for long integration times. As a result, SNR comparisons between two different image pixels must consider the performance of each pixel at a variety of integration times.

Figure 5:
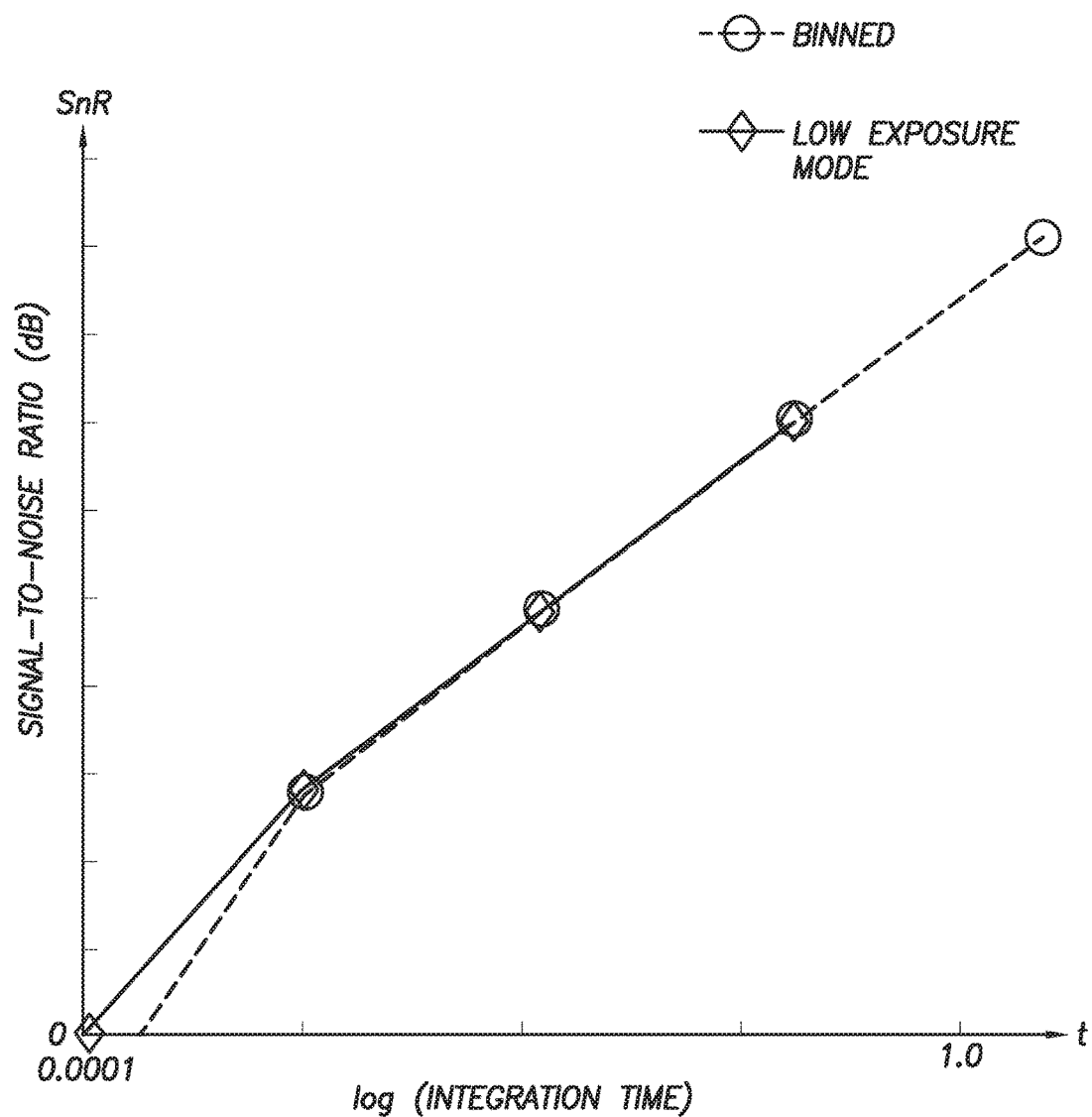
FIG. 5 is an illustrative graph of signal-to-noise ratio as a function of exposure time for image signals read out from the multi-conversion gain pixel of FIG. 3 in both low-exposure and binning modes.

FIG. 5 is an illustrative graph showing signal-to-noise ratio as a function of exposure time for image signals read out from the multi-conversion gain pixel of FIG. 3 in both low-exposure and binning modes. In particular, image signals generated using the binning method of FIG. 4A may have a signal to noise ratio that is only slightly lower than, and at some exposure times equal to, the SNR in low exposure mode. Typically, image signals captured by conventional pixels at high exposures have noticeably higher signal-to-noise ratios than image signals captured in low exposure situations. Thus, the image pixel of FIG. 3 may exhibit an improved signal-to-noise ratio in high exposure situations compared to conventional low gain image pixels by distributing charge produced by a photodiode to separate floating diffusion nodes in multiple readout paths, and summing the resulting voltage swings into a binned image signal.

Generally, image pixels in a sensor may be optimized to detect a particular wavelength of visible light. For example, each image pixel 22 in pixel array 20 may include a color filter that only transmits light of a narrow range of wavelengths. In one embodiment, color filter elements for pixels 22 may be red color filter elements (e.g., photoresistive material that transmits red light while reflecting and/or absorbing other colors of light), blue color filter elements (e.g., photoresistive material that transmits blue light while reflecting and/or absorbing other colors of light), and/or green color filter elements (e.g., photoresistive material that transmits green light while reflecting and/or absorbing other colors of light). Image pixels with a red color filter element may be referred to herein as a red image pixel. Likewise, image pixels having blue and green color filter elements may be referred to herein as blue pixels and green pixels, respectively.

Figure 6:
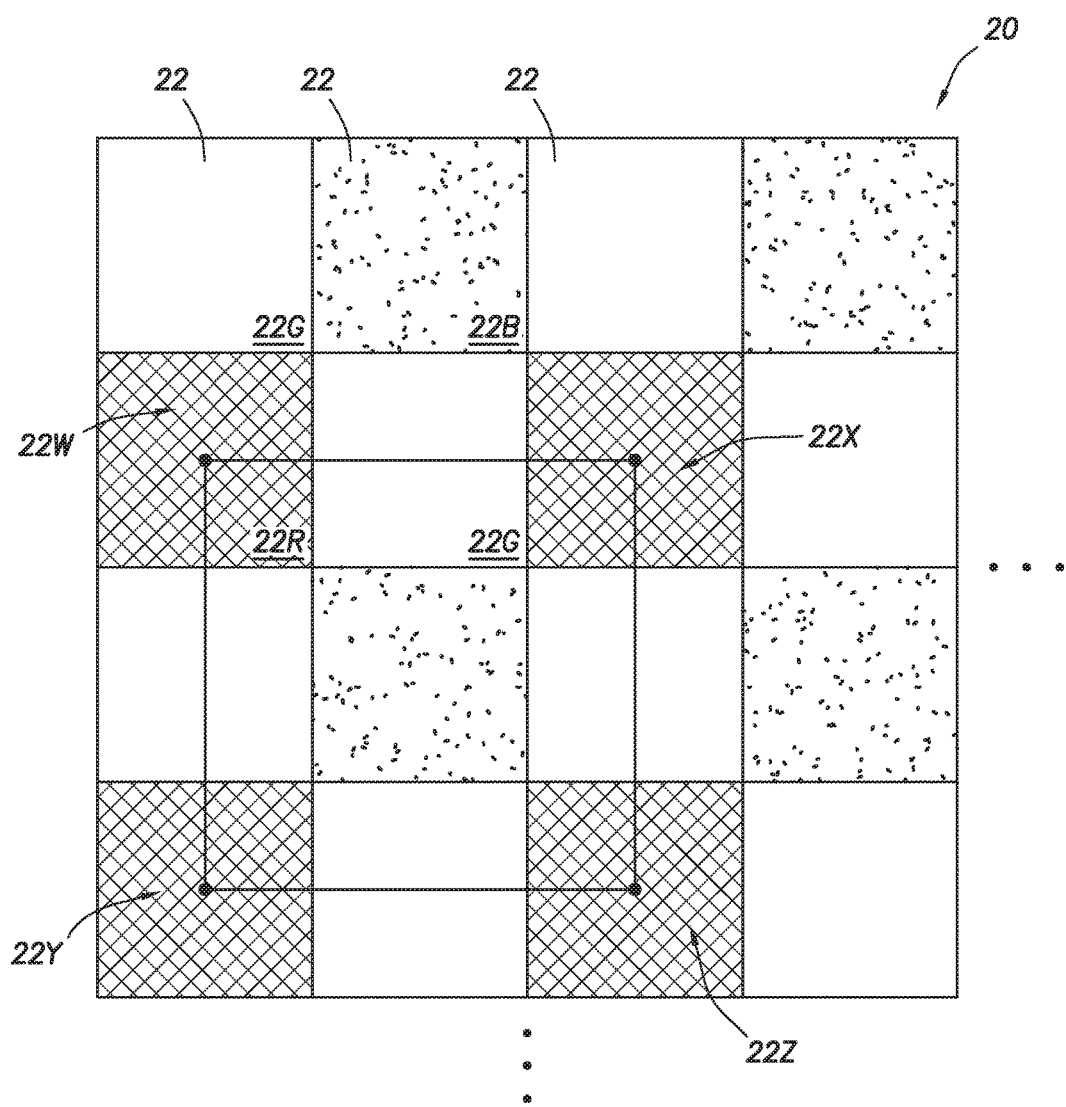
FIG. 6 is a diagram of an illustrative pixel array in which red, blue, and green image pixels are arranged in a Bayer mosaic grid pattern in accordance with an embodiment.

A typical image pixel array may include red, blue, and green pixels interspersed together in order to effectively capture light across the visible spectrum. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. A typical Bayer mosaic pattern is illustrated in FIG. 6. Each square in the grid may represent an image pixel of a particular color. Specifically, each two-by-two square of image pixels 22 in array 20 may contain two green image pixels 22G diagonally opposite from one another and a red image pixel 22R diagonally opposite from blue image pixel 22B.

In the Bayer mosaic pattern illustrated in FIG. 6, the corners of each 3-by-3 square of image pixels may be pixels of the same color. For example, the corners of the bottom left-most 3-by-3 pixel arrangement may be the red pixels 22W, 22X, 22Y, and 22Z. Collectively, pixels 22W, 22X, 22Y, and 22Z may be referred to herein as a like-color plane. It should be appreciated that like-color planes may also be defined for a group of blue pixels 22B or a group of green pixels 22G. Thus, the example of FIG. 6 in which pixels 22W, 22X, 22Y, and 22Z are red pixels is merely illustrative.

In low exposure situations, when the intensity of light incident on the pixel array is relatively low, it may be desirable to combine image signals from neighboring pixels of a like-color plane into a single binned signal of greater magnitude. Binning like-color planes in this manner may reduce demosaic artifacts and provide improved handling of floating diffusion overflow. However, binning image signals from spatially separate image pixels into a combined output may reduce the resolution of the image sensor. Therefore, it may also be desirable to read out image signals from each pixel individually in situations where binning is unnecessary (i.e., high exposure image captures).

Figure 7:
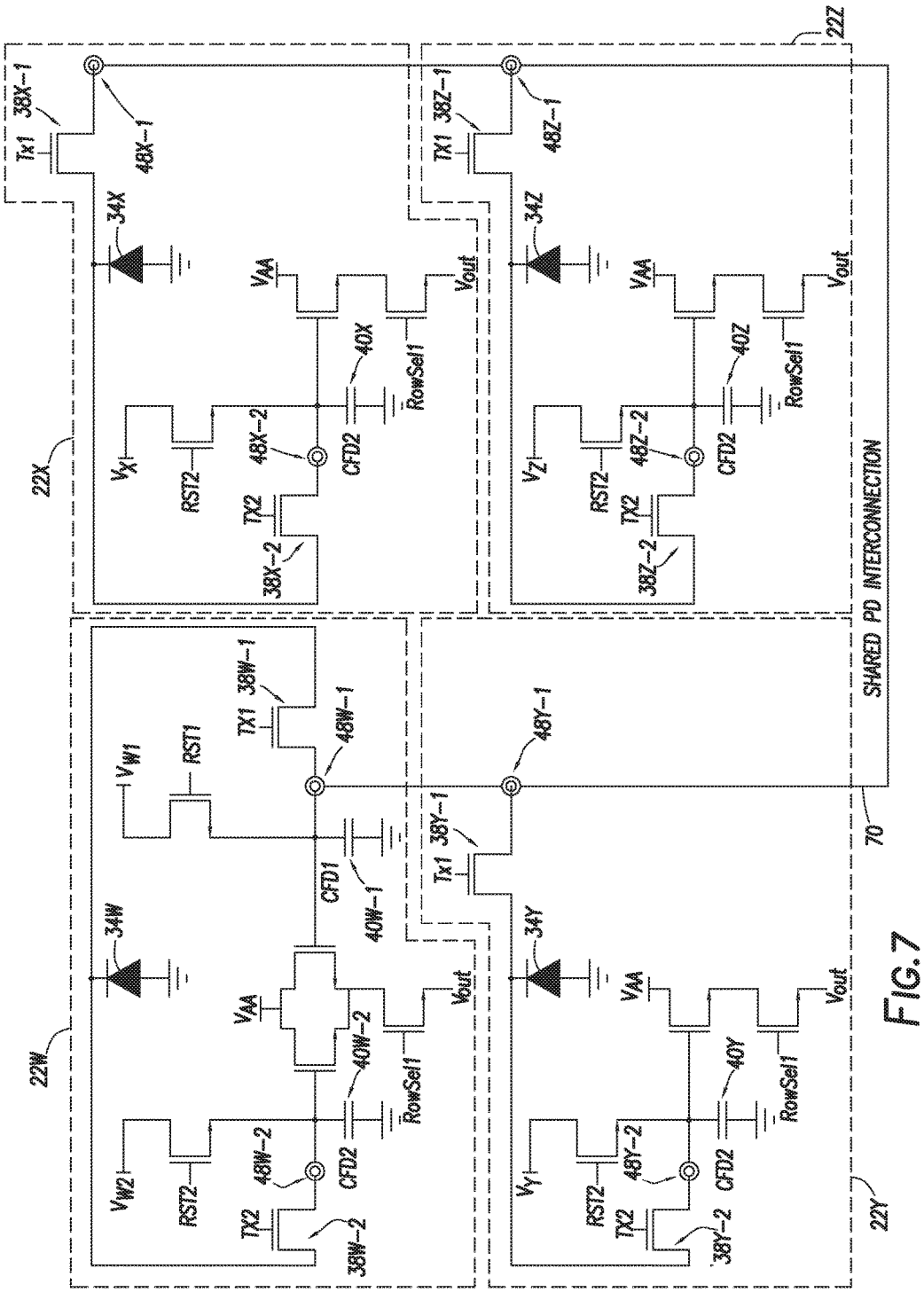
FIG. 7 is an illustrative circuit diagram of four interconnected image pixels having multiple readout paths that enable the pixels to operate in both a binning mode and a full resolution mode in accordance with an embodiment.

FIG. 7 is a circuit diagram of four image pixels in a like-color that are operable in both a low exposure mode (in which image signals from each pixel are binned and readout on a single path) and a full resolution mode (in which image signals from each pixel are read out through separate paths). The four pixels 22W, 22X, 22Y, and 22Z may, as an example, correspond to the four red pixels 22W, 22X, 22Y, and 22Z illustrated in the Bayer mosaic pattern of FIG. 6.

One of the four image pixels (e.g., upper left image pixel 22W) in the group may have two readout paths similar to image pixel 22 of FIG. 3. In particular, the first readout path may include a first floating diffusion node 40W-1 with capacitance CFD1. A first charge transfer gate 38W-1 that receives first charge transfer control signal TX1 may be coupled between the floating diffusion node and photodiode 34W. A first reset transistor may also be connected to floating diffusion node 40W-1. The gate terminal of the first reset transistor may be receive a first reset signal, while the source terminal may receive a variable power supply signal $V_{W1}$. The first readout path may also include a source follower transistor coupled to floating diffusion node 40W-1 that passes an image signal proportional to the stored charge to the row select transistor of pixel 22W.

Similarly, the second readout path of pixel 22W may include a second floating diffusion node 40W-2 with capacitance CFD2. The capacitance of the second FD node CFD2 may be greater than the capacitance of the first FD node CFD1. A second transfer gate 38W-2 may be coupled between photodiode 34W and the second floating diffusion node 40W-2. A second source follower transistor may be coupled to second FD node 40W-2 that passes an image signal proportion to the stored charge to the row select transistor. As in the first readout path, the second readout path in pixel 22W may include a second reset transistor coupled to floating diffusion node 40W-2 that receives second reset signal RST2 and variable power supply signal $V_{W1}$.

As shown in FIG. 7, the other three image pixels 22X, 22Y, and 22Z may have second readout paths that are nearly identical in structure to the second readout path of image pixel 22W. In particular, each second readout path in pixels 22X, 22Y, and 22Z may include a floating diffusion node with capacitance CFD2 (i.e., floating diffusion nodes 40X, 40Y, and 40Z). Charge transfer from photodiodes 34X, 34Y, and 34Z in each image pixel to each respective floating diffusion node may be gated by a transfer transistor that receives charge transfer control signal TX2 (e.g., transfer gates 38X-2, 38Y-2, and 38Z-2). Floating diffusion nodes 40X, 40Y, and 40Z may each be coupled to a single source follower transistor that outputs an image signal proportional to stored charge to the row select transistor of pixel 22X, 22Y, and 22Z, respectively.

Unlike the image pixel of FIG. 3, however, the first readout path of pixels 22X, 22Y, and 22Z may not include a floating diffusion node. As a result, pixels 22X, 22Y and 22Z may each contain only one source follower. Instead, the first readout path of pixels 22X, 22Y, and 22Z may be connected to shared photodiode interconnection line 70 (e.g., a shared image signal readout path). As shown in FIG. 7, shared photodiode interconnection line 70 may be connected to junction 48W-1 coupled to floating diffusion node 40W-1 in the first readout path of image pixel 22W. Charge transfer from photodiodes 34X, 34Y, and 34Z onto shared photodiode interconnection line 70 may be gated by first transfer gates 38X-1, 38Y-1, and 38Z-1, respectively. Thus, while charge transfer control signal TX1 is asserted, charge generated by photodiodes 34X, 34Y, and 34Z may be passed onto photodiode interconnection line 70 and binned (i.e., added and stored) in first floating diffusion node 38W-1. In this way, node 38W-1 may serve as a shared floating diffusion node for all four image pixels 22W, 22X, 22Y, and 22Z. A source follower transistor coupled to shared floating diffusion node 38W-1 may output a binned image signal proportion to the binned charge to the row select transistor of pixel 22W for readout.

It should be appreciated that photodiodes 34W, 34X, 34Y, and 34Z may be formed in a separate image sensor die from the floating diffusion nodes and readout circuitry. In particular, photodiodes 34W, 34X, 34Y, and 34Z may be formed in a first image sensor die that is stacked on top of a second die that includes the floating diffusion nodes and associated readout circuitry. In this case, first readout paths in image pixels 22W, 22X, 22Y, and 22Z may also include junctions 48W-1, 48X-1, 48Y-1, 48Z-1, 48W-2, 48X-2, 48Y-2, and 48Z-2 that may electrically couple signal lines from the photodiodes to their respective readout circuits.

In high exposure situations (i.e., full resolution mode), each image pixel 22W, 22X, 22Y, and 22Z may be operated according to the method of FIG. 4B. In particular, charge transfer control signals TX1 may deasserted prior to exposure to disable charge transfer through the first, low capacitance readout path in each pixel. In the embodiment of FIG. 7, disabling transfer gates 38X-1, 38Y-1, and 38Z-1 may prevent charge transfer from photodiodes 34X, 34Y, or 34Z onto shared photodiode interconnection line 70. As a result, the charge stored in shared floating diffusion node 40W-1 may be zero in full resolution mode (i.e., no binning is performed). On the other hand, charge transfer control signals TX2 may be asserted to enable transfer gates 38W-2, 38X-2, 38Y-2, and 38Z-2 in the second, high capacitance readout paths of each image pixel to allow charge transfer to each respective floating diffusion node (e.g., floating diffusion nodes 40W-2, 40X-2, 40Y-2, and 40Z-2). The source followers in each readout path may then output individual image signals proportional to the charge stored in each floating diffusion node to the readout transistors in pixels 22W, 22X, 22Y, and 22Z. In this way, distinct image signals may be generated by pixels 22W, 22X, 22Y, and 22Z and read out on separate column lines in high exposure mode. Thus, all four pixels 22W, 22X, 22Y, and 22Z are operated like the image pixel of FIG. 3 in low conversion gain mode.

In low exposure situations, however, charge transfer control signals TX2 provided to transfer gates 38W-2, 38X-2, 38Y-2, and 38Z-2 in the high capacitance readout paths may be deasserted prior to an image capture operation. Instead, charge transfer control signals TX1 may be asserted to pass charge generated by photodiodes 34X, 34Y, and 34Z onto shared photodiode interconnection line 70. The charge on shared PD interconnect 70 may then be binned at shared floating diffusion node 40W-1 with charge generated by photodiode 34W. A binned image signal proportional to the total charge stored at shared floating diffusion node 40W-1 may be then be read out on a single column line coupled to pixel 22.

Thus, the arrangement of FIG. 7 may allow binning of image signals from neighboring pixels in like-color planes in low exposure situations (i.e., low resolution mode), while also allowing image signals to be generated and read out through each pixel individual in high exposure situations (i.e., full resolution mode). It should be appreciated that, while FIG. 7 shows four image pixels connected by a shared signal path, any suitable number of pixels may be connected together in this manner to allow image signal binning for low exposure levels.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
a photodiode in an image sensor pixel;
first and second image signal readout paths coupled to the photodiode, wherein at least one of the first and second image signal readout paths is selectively switched into use based on an exposure level;
a signal output line for the image sensor pixel, wherein the first image signal readout path is coupled to the output line through a first source follower transistor and wherein the second image signal readout path is coupled to the signal output line through a second source follower transistor, wherein the first and second source follower transistors are coupled in parallel between a voltage source and the signal output line; and
an adjustable power supply configured to supply a first voltage to a gate terminal of the first source follower transistor in a first mode of operation that enables the first image signal readout path and the first source follower transistor to begin performing readout operations and configured to supply a second voltage to the gate terminal in a second mode of operation that disables the first image signal readout path and the first source follower transistor.

2. The image sensor of claim 1, further comprising:
a first charge transfer gate interposed in the first image signal readout path; and
a second charge transfer gate interposed in the second image signal readout path.

3. The image sensor of claim 1, further comprising:
a first floating diffusion node in the first image signal readout path, wherein the first floating diffusion node has a first capacitance; and
a second floating diffusion node in the second image signal readout path, wherein the second floating diffusion node has a second capacitance that is equal to the first capacitance.

4. The image sensor of claim 3, wherein only the first image signal readout path is enabled when the exposure level is low.

5. The image sensor of claim 3, wherein both the first and second image signal readout paths are enabled when the exposure level is high.

6. The image sensor of claim 1, further comprising:
a first floating diffusion node in the first image signal readout path, wherein the first floating diffusion node has a first capacitance; and
a second floating diffusion node in the second image signal readout path, wherein the second floating diffusion node has a second capacitance that is greater than the first capacitance.

7. The image sensor of claim 6, wherein only the first image signal readout path is enabled when the exposure level is low.

8. The image sensor of claim 6, wherein only the second image signal readout path is enabled when the exposure level is high.

9. The image sensor of claim 1, wherein the first image signal readout path is selectively disabled using the second voltage.

10. The image sensor of claim 9, wherein the adjustable power supply includes a multiplexer configured to supply one of the first or second voltages to the first image signal readout path.

11. A method of operating an image sensor, comprising:
determining an exposure level;
accumulating charge with a photodiode in the image sensor, wherein the photodiode is coupled to first and second image signal readout paths, wherein a charge storage region is interposed in the first image signal readout path;
selectively enabling at least one of the first and second image signal readout paths based on the exposure level;
with a selection circuit coupled to the charge storage region via a source-drain region of a reset transistor, providing a first voltage level to the source-drain region when the first image signal readout path is enabled; and
with the selection circuit, providing a second voltage level to the source-drain region when the first image signal readout path is disabled.

12. The method of claim 11, further comprising:
disabling at least one of the first and second image signal readout paths while the selected image signal readout path is enabled.

13. The method of claim 11, wherein selectively enabling at least one of the first second image signal readout paths based on the exposure level comprises:
in response to determining that the exposure level is less than a predetermined threshold, selectively enabling only the first image signal readout path; and
in response to determining that the exposure level is greater than the predetermined threshold, simultaneously enabling the first and second image signal readout paths.

14. The method of claim 11, wherein selectively enabling at least one of the first second image signal readout paths based on the exposure level comprises:
in response to determining that the exposure level is less than a predetermined threshold, selectively enabling only the first image signal readout path; and
in response to determining that the exposure level is greater than the predetermined threshold, selectively enabling only the second image signal readout path.

15. An image sensor, comprising:
a plurality of image sensor pixels, each of which comprises:
a photodiode; and
an image signal readout path, wherein the plurality of image sensor pixels are coupled to a shared image sensor readout path, wherein a given image sensor pixel in the plurality of image sensor pixels comprises a first diffusion region that is coupled to the image signal readout path in the given image sensor pixel and a second diffusion region that is coupled to the shared image sensor readout path and that is different from the first diffusion region, wherein the given image sensor pixel is configured to read out a signal from the photodiode in the given image sensor pixel using the image signal readout path in the given image sensor pixel and the first diffusion region in a first mode of operation, and wherein the given image sensor pixel is configured to store signals from the respective photodiodes in the plurality of image sensor pixels at the second diffusion region and to read out the signals using the shared image sensor readout path in a second mode of operation.

16. The image sensor of claim 15, wherein the plurality of image sensor pixels are all associated with the same color.

17. The image sensor of claim 15, wherein the first diffusion region in the given image sensor pixel has a first capacitance and wherein the second diffusion region in the given image sensor pixel has a second capacitance that is smaller than the first capacitance.

18. The image sensor of claim 17, wherein a first portion of the plurality of image sensor pixels is formed in a first die, and wherein a second portion of the plurality of image sensor pixels is formed in a second die that is stacked on top of the first die.

19. The image sensor of claim 15, wherein the given image sensor pixel has two source-follower transistors respectively coupled to the first and second floating diffusion regions, and wherein each image sensor pixel other than the given image sensor pixel in the plurality of image sensor pixels has only one source-follower transistor.

20. The image sensor of claim 15, wherein the given image sensor pixel is configured to connect the first diffusion region to a reference voltage supply in the second mode of operation.

* * * * *